US009403722B2

(12) United States Patent
Ando et al.

(10) Patent No.: US 9,403,722 B2
(45) Date of Patent: Aug. 2, 2016

(54) SINTERED OBJECTS AND PROCESSES FOR PRODUCING SAME

(75) Inventors: Kazuto Ando, Tokyo (JP); Shintaro Hayashi, Tokyo (JP); Hirokuni Kugimoto, Tokyo (JP); Masayuki Ishizuka, Tokyo (JP)

(73) Assignee: SUMITOMO OSAKA CEMENT CO., LTD. (JP)

( * ) Notice: Subject to any disclaimer, the term of this patent is extended or adjusted under 35 U.S.C. 154(b) by 0 days.

(21) Appl. No.: 13/577,585

(22) PCT Filed: Feb. 8, 2011

(86) PCT No.: PCT/JP2011/052598
§ 371 (c)(1),
(2), (4) Date: Aug. 7, 2012

(87) PCT Pub. No.: WO2011/099466
PCT Pub. Date: Aug. 18, 2011

(65) Prior Publication Data
US 2012/0298910 A1    Nov. 29, 2012

(30) Foreign Application Priority Data

| Feb. 9, 2010 | (JP) | 2010-026817 |
| Jun. 30, 2010 | (JP) | 2010-149324 |
| Jan. 18, 2011 | (JP) | 2011-007809 |
| Jan. 25, 2011 | (JP) | 2011-012861 |

(51) Int. Cl.
*H01B 1/02* (2006.01)
*H01B 1/06* (2006.01)
(Continued)

(52) U.S. Cl.
CPC ............... *C04B 35/505* (2013.01); *B82Y 30/00* (2013.01); *C04B 35/6263* (2013.01);
(Continued)

(58) Field of Classification Search
CPC ............. H01B 1/02; H01B 1/04; H01B 1/14; C09K 5/08; C09K 5/00; C04B 35/505; C04B 35/64

USPC ......... 252/71, 520.5, 502; 428/408; 502/95.2, 502/99, 152
See application file for complete search history.

(56) References Cited

U.S. PATENT DOCUMENTS 7,214,430 B2 * 5/2007 Handa et al. .................. 428/408
7,250,215 B2 * 7/2007 Yoshikawa et al. ........... 428/408
(Continued)

FOREIGN PATENT DOCUMENTS

JP    A-11-246263    9/1999
JP    A-2002-255647    9/2002
(Continued)

OTHER PUBLICATIONS

Machine translation: JP 2006-176349 A, Kubo et al., published Jul. 2006.*
Machine translation: JP 2009-184881 A, Hayashi et al., published Aug. 2009.*
International Search Report for International Application No. PCT/JP2011/052598 mailed Apr. 19, 2011.
(Continued)

*Primary Examiner* — Jane L Stanley
(74) *Attorney, Agent, or Firm* — Merchant & Gould P.C.

(57) ABSTRACT

Provided is a sintered object which has excellent resistance to corrosion by corrosive halogen gases and by the plasmas thereof and has excellent thermal conductivity and excellent electrical conductivity. The sintered object has few limitations on design, is usable in a wide range of applications, and is highly versatile. The sintered object has no frequency dependence when a high-frequency voltage is applied thereto and with which it is possible to actualize the stability of a plasma. Also provided is a method for producing the sintered object. Furthermore provided is a high-frequency transmission material which has direct-current electrical conductivity for reducing fluctuations in plasma potential and has capacitive properties that enable the material to transmit high-frequency power necessary for plasma excitation, and which has no fear of causing contamination of a sample with a metal and has resistance to corrosion by plasmas.

15 Claims, 1 Drawing Sheet

(51) Int. Cl.
  *C04B 35/505* (2006.01)
  *C09K 5/00* (2006.01)
  *C04B 35/64* (2006.01)
  *C04B 35/626* (2006.01)
  *C04B 35/645* (2006.01)
  *C04B 35/80* (2006.01)
  *B82Y 30/00* (2011.01)
  *H01J 37/32* (2006.01)

(52) U.S. Cl.
  CPC .... *C04B 35/62635* (2013.01); *C04B 35/62695* (2013.01); *C04B 35/64* (2013.01); *C04B 35/645* (2013.01); *C04B 35/803* (2013.01); *C09K 5/00* (2013.01); *H01J 37/3255* (2013.01); *H01J 37/32477* (2013.01); *H01J 37/32642* (2013.01); *C04B 2235/405* (2013.01); *C04B 2235/526* (2013.01); *C04B 2235/5248* (2013.01); *C04B 2235/5264* (2013.01); *C04B 2235/5268* (2013.01); *C04B 2235/5288* (2013.01); *C04B 2235/5436* (2013.01); *C04B 2235/5445* (2013.01); *C04B 2235/77* (2013.01); *C04B 2235/85* (2013.01); *C04B 2235/9607* (2013.01); *C04B 2235/9692* (2013.01)

(56) References Cited

U.S. PATENT DOCUMENTS 7,597,999 B2 * 10/2009 Mao .................. C01B 31/04
                                                252/502
8,119,095 B2 *  2/2012 Ahn .................. B82Y 30/00
                                                252/502
8,501,048 B2 *  8/2013 Ueno ................ C22C 32/0084
                                                252/502

FOREIGN PATENT DOCUMENTS

| JP | A-2003-146758 | 5/2003 |
| JP | A-2003-152062 | 5/2003 |
| JP | A-2004-244273 | 9/2004 |
| JP | A-2005-183833 | 7/2005 |
| JP | A-2005-203444 | 7/2005 |
| JP | A-2006-176349 | 7/2006 |
| JP | A-2006-337118 | 12/2006 |
| JP | A-2007-277067 | 10/2007 |
| JP | A-2009-184881 | 8/2009 |

OTHER PUBLICATIONS

Office Action for Japanese Patent Application No. 2010-149324 (mailed Jul. 1, 2014).

* cited by examiner

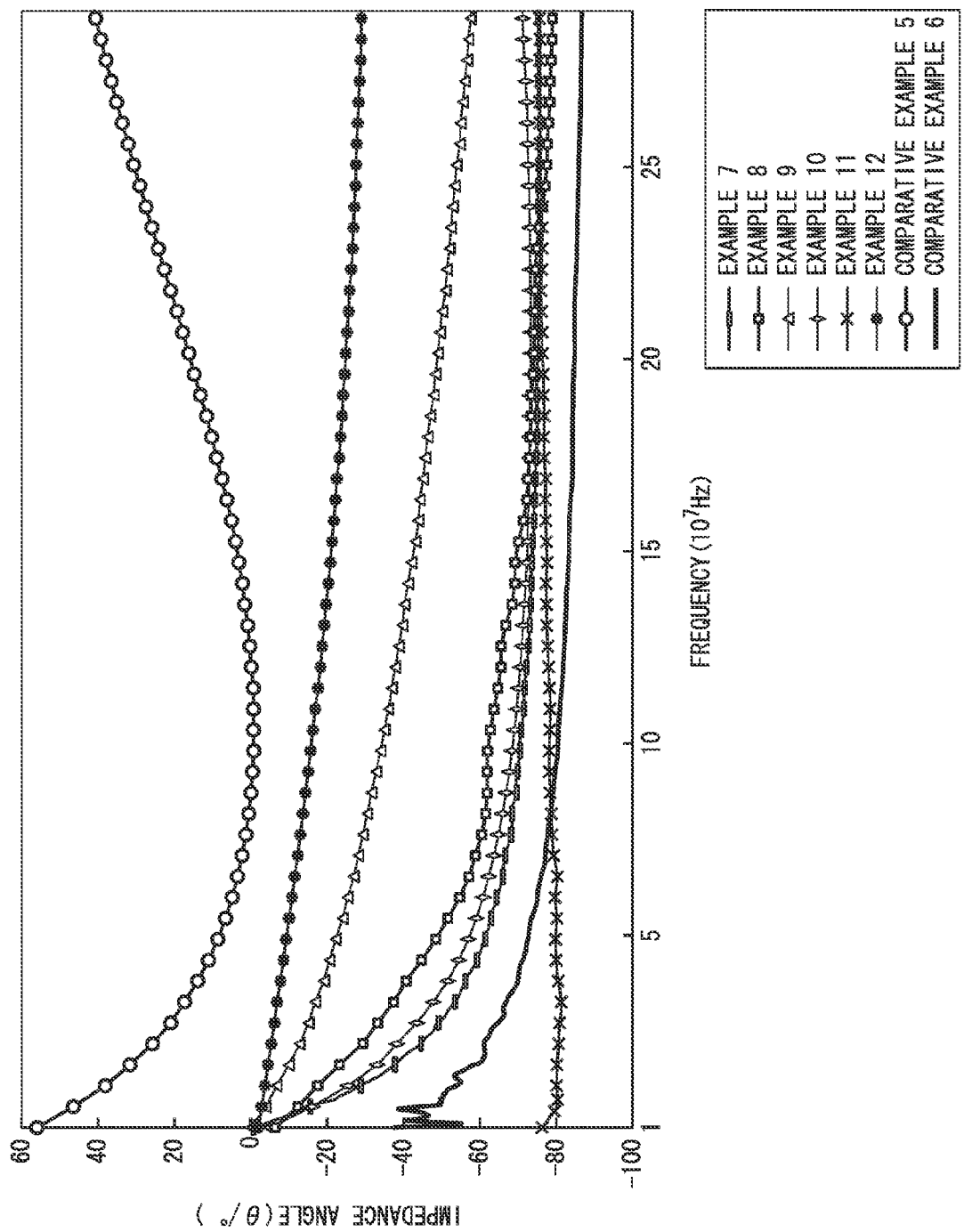

SINTERED OBJECTS AND PROCESSES FOR PRODUCING SAME

This application is a National Stage Application of PCT/JP2011/052598, filed 8 Feb. 2011, which claims benefit of Serial No. 2010-026817, filed 9 Feb. 2010; Serial No. 2010-149324, filed 30 Jun. 2010, Serial No. 2011-007809, filed 18 Jan. 2011 and Serial No. 2011-012861 filed 25 Jan. 2011 in Japan and which applications are incorporated herein by reference. To the extent appropriate, a claim of priority is made to each of the above disclosed applications.

TECHNICAL FIELD

The present invention relates to a sintered object and a method for producing the same, and more specifically, to a sintered object which is preferably applied as a configuration member of a vacuum process device such as an etching device, a sputtering device and a CVD device applied to a production process of a semiconductor, a liquid crystal display or the like and has excellent resistance to corrosion against halogen-based corrosive gases and plasmas thereof and has excellent thermal conductivity and excellent electrical conductivity, and a method of producing the same.

Furthermore, the present invention relates to a high frequency transmission material, and more specifically, to a high frequency transmission material which is preferably used in a plasma processing device using high frequency applied to a production process such as a semiconductor device, and has excellent stability of plasma caused by high frequency application to a sample.

Furthermore, the present invention relates to a sintered object and a method of producing the same, and more specifically, to a sintered object which has excellent resistance to corrosion against halogen-based corrosive gases and the plasmas thereof and has excellent electrical conductivity, has no frequency dependency on electrical characteristics (an impedance angle) when applying high frequency, and is preferably used in a member exposed to the halogen-based corrosive gases and the plasmas thereof and the high frequency application member of a vacuum process device such as an etching device, a sputtering device, and a CVD device used in a production process such as a semiconductor device and a liquid crystal display, and a method of producing the same.

This application claims priority to and the benefit of Japanese Patent Application No. 2010-026817 filed on Feb. 9, 2010, Japanese Patent Application No. 2010-149324 filed on Jun. 30, 2010, Japanese Patent Application No. 2011-007809 filed on Jan. 18, 2011, and Japanese Patent Application No. 2011-012861 filed on Jan. 25, 2011, the contents of which are incorporated herein by reference.

BACKGROUND ART

In the related art, in a production line of a semiconductor device such as an IC, an LSI, and a VLSI, for example, as a member which is used in a strict condition which is exposed to halogen-based corrosive gases such as chlorine and fluorine and the plasmas thereof, a member and a component formed of ceramics such as an alumina has been widely used. For example, as the ceramic component in the semiconductor producing device, an electrostatic chuck, a clamp ring, a focus ring, an etching electrode or the like is adopted. As a material forming the components, a ceramic material having improved resistance to corrosion is suggested (for example, see PTL 1 and PTL 2).

Furthermore, in a process of using the halogen-based corrosive gases and the plasmas thereof, a member such as the etching electrode and the focus ring in which the electrical conductivity in addition to resistance to corrosion is required, is used. As such a member, for example, a member in which carbon nanotubes are added to an insulating ceramic such as aluminum oxide or a member in which silicon carbide is added to aluminum nitride is suggested (for example, see PTL 3 and PTL 4).

Thus, in a case of adding the silicon carbide as the electrical conductive material, silicon carbide itself does not have sufficient resistance to corrosion against the halogen-based plasma, and the particle shape of silicon carbide is a spherical shape. Thus, in order to exhibit electrical conductivity, there is a need to set the content of silicon carbide to 20 volume % or more with respect to 100 volume % of aluminum nitride as a base material. However, when the content of silicon carbide is 20 volume % or more, there is a problem in that the resistance to the corrosion of a composite material formed of aluminum nitride and silicon carbide to halogen-based corrosive gases and the plasmas thereof is greatly lowered.

Furthermore, in a case of adding carbon nanotubes to the insulating ceramics, dispersion properties of the carbon nanotubes are degraded, and thus there is a problem in that the resistance to corrosion of the halogen-based plasma and the electrical conductivity are lowered.

Thus, in order to solve the problems mentioned above, a sintered object has been suggested which contains yttrium oxide or yttrium-aluminum composite oxide, and fibrous carbon, in which the fibrous carbon is three-dimensionally dispersed in a grain boundary of yttrium oxide or yttrium-aluminum composite oxide, and has a aggregation diameter of the fibrous carbon of 10 μm or less (PTL 5).

The sintered object can prevent a decline in resistance to corrosion and electrical conductivity under a halogen-based plasma atmosphere.

Furthermore, in the related art, in a member of the plasma processing device used in a production line of a semiconductor device such as an IC, an LSI, and a VLSI, a member such as a power introduction window, a gas dispersion plate, and a wafer holding electrode needs to be supplied with high frequency electric power from a power source in a transmission manner. Thus, the members are constituted by a material behaving as an insulator to the direct current, that is, dielectric.

As the dielectric, aluminum oxide (alumina) and ceramics such as a silicon carbide are used, since those elements cause low pollution of the wafer and have excellent resistance to corrosion of the plasma.

Recently, as the material having excellent resistance to corrosion of the fluorine-based plasma, yttrium oxide (yttria) has been considered.

Meanwhile, in the etching processing in the semiconductor production process, in addition to the plasma of the reactive gas, a method of applying high frequency to the processing wafer as bias electric power has been generally used. In this method, bias electric power is superimposed on the electric power of the plasma, and the electric potential of the plasma fluctuates in a direct current manner. However, since the device material is an insulating material to the direct current, the electric potential fluctuation of the plasma is not alleviated, and thus, an electric field is generated in the processing wafer to destroy a circuit formed on the wafer, and as a consequence, a proportion of a product which is defective may increase.

Thus, in order to suppress the electric potential fluctuation of the plasma mentioned above, a plasma processing device has been suggested in which a surface section through which plasma is directly seen in a reaction chamber inner wall is covered by the dielectric, an electrical conducting section is provided in a part of the dielectric covering section, and a DC earth is provided in the electrical conducting section (PTL 6). As the DC earth, aluminum alloy, stainless steel or the like is used.

PRIOR ART DOCUMENTS

Patent Literatures

[PTL 1] JP-A-H11-246263
[PTL 2] JP-A-2002-255647
[PTL 3] JP-A-2004-244273
[PTL 4] JP-A-2003-152062
[PTL 5] JP-A-2009-184881
[PTL 6] JP-A-2005-183833

SUMMARY OF INVENTION

Technical Problem

However, in the sintered object in which the fibrous carbon is three-dimensionally dispersed in the grain boundary mentioned above, volume resistivity properties are high, for example 10 Ω·cm or more. Thus, in a case where the sintered objected is used under various conditions in various vacuum process devices, there is a need for electrical matching properties with a member for the vacuum process device used concurrently, and there is a problem in that the design is limited. Furthermore, the device and the application range, to which the sintered object can be applied, are limited, and there is a difficulty in terms of versatility.

Furthermore, in the method of producing the sintered object, it is impossible to obtain the sintered object having the volume resistivity properties of 10 Ω·cm or less, and thus, it is impossible to obtain the sintered object which has excellent resistance to corrosion of the halogen-based corrosive gases and the plasmas thereof, has excellent thermal conductivity, has the volume resistivity properties of 10 Ω·cm or less, and also has excellent electrical conductivity.

Meanwhile, in the plasma processing device in which the DC earth is installed in the electrical conducting section of the related art mentioned above, there is a problem in that the metal forming the DC earth such as aluminum alloy and stainless steel comes into contact with the reactive gas to generate metal ions in the device, and the metal ions contaminate the wafer and increase a proportion of a product which is defective.

Furthermore, in a case of using the DC earth for an extended period of time, the surface of the DC earth becomes corroded, whereby the electrical conductivity to the direct current is degraded, and as a consequence, there is a problem in that a suppression effect of the plasma electrical potential fluctuation is lowered.

Furthermore, in a case where the sintered object, in which the fibrous carbon is three-dimensionally dispersed in the grain boundary, is used in the etching processing of the semiconductor production process, a method of applying high frequency to the wafer becoming the processing target through the sintered object as the bias in addition to the plasma of the reactive gas is used. However, when changing the frequency of high frequency, if the electrical characteristics of the sintered object, that is, capacitive properties, resistant properties, dielectric or the like fluctuate, stability of the plasma may be considerably lowered.

Furthermore, when the electrical matching properties with other members in the etching device are degraded, for example, the impedance matching is degraded, there is a problem in that the design is restricted, the using device and the range are limited, and the versatility decreases.

Furthermore, when producing the sintered object, after spraying and drying the mixed slurry in which the yttrium oxide slurry is mixed with the fibrous carbon slurry, there is a need to sinter the obtained granules under a pressurization of 1 MPa or more and 20 MPa or less. However, for example, when there is a need to cope with a new need in which the member is increased in size accompanied by an increase in size of the etching processing device or the like, an increase in size of the pressurization sintering device used in the production process of the sintered object is limited. Thus, there is a problem in that it is difficult to cope with the new need.

The present invention has been made under these circumstances, and an object thereof is to provide a sintered object which has excellent resistance to corrosion of the halogen-based corrosive gases and the plasmas thereof, has excellent thermal conductivity, has excellent electrical conductivity, and has no restrictions on design, a wide application range, excellent versatility when applied to a member used for various vacuum process device, and a method of producing the same.

Furthermore, another object of the present invention is to provide a high frequency transmission material which has conductivity to the direct current which requires to restrict a plasma electrical potential fluctuation, and capacitive properties capable of transmitting the high frequency electric power required for the excitation of the plasma, and in which the sample may not be contaminated by the metal, and which has the resistance to corrosion of plasma.

Furthermore, another embodiment of the present invention is to provide a sintered object which has electrical conductivity having high versatility when being used as a member for production device of the production process of the semiconductor device and the liquid crystal display or the like, and particularly, has excellent resistance to corrosion of the halogen-based corrosive gases and the plasmas thereof when being used as the member for the plasma device, has no dependence on the frequency when high frequency is applied, and is able to exhibit stability of the plasma, and a method of producing the same.

Solution to Problem

The present inventors carefully conducted investigations in order to solve the problems mentioned above, and knew that, if a relative density of the sintered object containing yttrium oxide and fibrous carbon is 97% or more, the volume resistivity value is 0.5 Ω·cm or more and is 10 Ω·cm or less, the fibrous carbon is three-dimensionally dispersed, and the aggregation diameter is 5 μm or less, then a sintered object having excellent resistance to corrosion of halogen-based corrosive gases and the plasmas thereof, having excellent thermal conductivity, having a volume resistivity value of 10 Ω·cm or less, and having excellent electrical conductivity is obtained, thereby leading to the completion of the present invention.

That is, a sintered object A of the present invention contains yttrium oxide and fibrous carbon, has a relative density of 97% or more, and a volume resistivity value of 0.5 Ω·cm or more and 10 Ω·cm or less. The fibrous carbon is characterized by being three-dimensionally dispersed and having the aggregation diameter of 5 μm or less.

It is preferable that the fibrous carbon is one type or two types or more selected from a group consisting of single-walled carbon nanotubes, two-walled carbon nanotubes and multi-walled carbon nanotubes.

A content of the fibrous carbon is preferably 0.5 volume % or more and 5 volume % or less with respect to a total amount of fibrous carbon and yttrium oxide.

A method of producing the sintered object A of the present invention includes a mixed slurry preparing process of mixing a yttrium oxide slurry with a fibrous carbon slurry to form a mixed slurry, a granule forming process of spray-drying the mixed slurry to form the granules, and a sintering process of the granules under a pressure of 1 MPa or more and 20 MPa or less to form a sintered object.

An average secondary particle diameter of fibrous carbon in the fibrous carbon slurry is preferably 400 nm or less.

In addition, the present inventors carefully conducted investigations in order to solve the problems mentioned above, and knew that, if a composite material, in which fibrous carbon such as a carbon nanotubes is dispersed in yttrium oxide, is used as a material transmitting the high frequency, and the composite material contains fibrous carbon at 1 volume % or more and 10 volume % or less with respect to the total amount of the fibrous carbon and yttrium oxide, the electrical conductivity to the direct current is increased, the high frequency can be transmitted through the material, the sample has no risk of metal contamination, and the resistance to corrosion of plasma is excellent, thereby leading to the completion of the present invention.

That is, a high frequency transmission material of the present invention is formed of a composite material in which the fibrous carbon is dispersed in yttrium oxide, and contains the fibrous carbon of 1 volume % or more and 10 volume % or less with respect to the total amount of the fibrous carbon and the yttrium oxide.

A volume resistivity value during application of the direct-current voltage is preferably 30 Ω·cm or less and an impedance angle in a high frequency band of 10 MHz or more is preferably a negative value.

The fibrous carbon is preferably carbon nanotubes.

The fibrous carbon is preferably dispersed in a grain boundary in the yttrium oxide.

Furthermore, the present inventors carefully conducted investigations in order to solve the problems mentioned above, and knew that, if the relative density of a sintered object containing yttrium oxide and fibrous carbon is 95% or more, the volume resistivity value is 30 Ω·cm or more and 1000 Ω·cm or less, the fibrous carbon is three-dimensionally dispersed in the grain boundary of yttrium oxide, and the aggregation diameter is 1 μm or less, a sintered object is obtained which has excellent electrical conductivity, has excellent resistance to corrosion of halogen-based corrosive gases and the plasmas thereof, has no frequency dependency when the high frequency is applied thereto, and can stabilize the plasma, thereby leading to the completion of the present invention.

That is, a sintered object B of the present invention contains yttrium oxide and fibrous carbon, has a relative density of 95% or more, has a volume resistivity value of 30 Ω·cm or more and 1000 Ω·cm or less, and the fibrous carbon is three-dimensionally dispersed in a grain boundary of the yttrium oxide and has an aggregation diameter of 1 μm or less.

The fibrous carbon is preferably one kind or two kinds or more selected from a group consisting of single-walled carbon nanotubes, two-walled carbon nanotubes and multi-walled carbon nanotubes.

A content of the fibrous carbon is preferably 0.5 volume % or more and 2 volume % or less with respect to a total amount of the fibrous carbon and yttrium oxide.

An average particle diameter of yttrium oxide is preferably 0.1 μm or more and 10 μm or less.

An impedance angle in a high frequency band of 10 MHz or more and 1 GHz or less is preferably in a range that is −90° or more and −70° or less.

A method of producing the sintered object B of the present invention includes a mixed slurry preparing process of mixing a yttrium oxide slurry with a fibrous carbon slurry to form a mixed slurry, a granule forming process by spray-drying the mixed slurry to form the granule, and a sintering process of the granule under pressure of 1 MPa or more and 20 MPa or less to form a sintered object.

An average secondary particle diameter of fibrous carbon in the fibrous carbon slurry is preferably 200 nm or less.

Advantageous Effects of Invention

According to the sintered object A of the present invention, the relative density of the sintered object containing yttrium oxide and fibrous carbon is 97% or more, the volume resistivity value is 0.5 Ω·cm or more and 10 Ω·cm or less, and the fibrous carbon is three-dimensionally dispersed in the sintered object and has the aggregation diameter of 5 μm or less. Thus, resistance to corrosion of the halogen-based corrosive gases and the plasmas thereof can be improved, a decline in electrical conductivity can also be reduced, and the electrical conductivity can also be improved by setting the volume resistivity value to be 10 Ω·cm or less.

Thus, when being applied to the member used in the plasma processing device, since the sintered object has excellent resistance to corrosion of the plasma and in-plane uniformity of plasma etching speed, and the generation of particles is low, the sintered object is particularly and suitably used in the etching electrode and the focus ring. Furthermore, even when being applied to the member used in various vacuum process devices, the restrictions on the design are few, the application range is also wide, and the versatility is excellent.

According to the method of producing sintered object A of the present invention, the method has a mixed slurry preparing process of mixing a yttrium oxide slurry with a fibrous carbon slurry to form a mixed slurry, a granule forming process by spray-drying the mixed slurry to form the granules, and a sintering process of sintering the granules under a pressure of 1 MPa or more and 20 MPa or less to form a sintered object. Thus, it is possible to easily obtain the sintered object in which resistance to corrosion of the halogen-based corrosive gases and the plasmas thereof and thermal conductivity are improved, and electrical conductivity is improved by setting the volume resistivity value to be 10 Ω·cm or less.

Furthermore, according to a the high frequency transmission material of the present invention, since a composite material, in which fibrous carbon is dispersed in yttrium oxide, is used, and which contains fibrous carbon at 1 volume % or more and 10 volume % or less with respect to the total amount of the fibrous carbon and yttrium oxide, the electrical conductivity to the direct current can be increased, and the high frequency electric power required for the excitation of the plasma can be transmitted therethrough.

Furthermore, since the fibrous carbon is dispersed in the yttrium oxide to form the composite material, even when the composite material comes into contact with the reactive gas, there is no risk of the generation of metal ions, and there is also no concern that the metal ions will contaminate the sample and increase the fraction defective of the product.

Furthermore, according to the sintered object B of the present invention, the relative density of a sintered object containing yttrium oxide and fibrous carbon is 95% or more, the volume resistivity value is 30 Ω·cm or more and 1000 Ω·cm or less, the fibrous carbon is three-dimensionally dispersed in the grain boundary of yttrium oxide, and the aggregation diameter is 1 μm or less. Thus, electrical conductivity is low, resistance to corrosion of halogen-based corrosive gases and the plasmas thereof can be improved, there is no frequency dependency when the high frequency is applied thereto, and the plasma can be stabilized.

Thus, when being applied to the member used in the plasma processing device, resistance to corrosion of the plasma and in-plane uniformity of plasma etching speed are excellent, and even when being applied to the member used in various vacuum process devices, the restrictions on the design are few, the application range is also wide, and the versatility is excellent.

According to the method of producing the sintered object B of the present invention, the method has a mixed slurry preparing process of mixing a yttrium oxide slurry with a fibrous carbon slurry to form a mixed slurry, a granule forming process by spray-drying the mixed slurry to form the granules, and a sintering process of the granule under a pressure of 1 MPa or more and 20 MPa or less to form a sintered object. Thus, it is possible to easily obtain the sintered object which has low electrical conductivity and an excellent resistance to corrosion of the halogen-based corrosive gases and the plasmas thereof, has no frequency dependency when the high frequency is applied thereto, and is able to stabilize the plasma.

BRIEF DESCRIPTION OF DRAWINGS

FIG. 1 is a diagram that shows an impedance angle in a high frequency band of 10 MHz to 300 MHz of the sintered object of Examples 7 to 12 and Comparative Examples 5 and 6.

DESCRIPTION OF EMBODIMENTS

Embodiments for carrying out a sintered object and a method of producing the same will be described.

In addition, embodiments mentioned below are specifically described so as to allow easier understanding of the gist of the present invention, but do not limit the present invention unless otherwise specified.

Sintered Object A

A sintered object A of the present embodiment contains yttrium oxide and fibrous carbon, has a relative density of 97% or more, a volume resistivity value of 0.5 Ω·cm or more and 10 Ω·cm or less, and the fibrous carbon is three-dimensionally dispersed and an aggregation diameter thereof is 5 μm or less.

In the sintered object A, yttrium oxide ($Y_2O_3$) particles having high resistance to corrosion of halogen-based plasma constitute a matrix.

An average particle diameter of the yttrium oxide particles is preferably 0.1 μm or more and 10 μm or less, and more preferably, 0.5 μm or more and 5 μm or less.

Herein, a reason for limiting the average particle size of yttrium oxide to 0.1 μm or more and 10 μm or less is as follows. When the average particle size is less than 0.1 μm, since a grain boundary total number of yttrium oxide in the sintered object is increased, there is a need to increase an addition amount of fibrous carbon so as to reveal electrical conductivity. However, when increasing the addition amount of fibrous carbon, resistance to corrosion is lowered and is not preferable. Meanwhile, when the average particle diameter is greater than 10 μm, since the addition amount of fibrous carbon is reduced, the electrical conductivity is improved, the grain boundary total amount of yttrium oxide in the sintered object is reduced. Thus, fibrous carbon locally exists, deviation is generated in the electrical conductivity in the sintered object, and when being applied to the vacuum process device, there is a risk of an occurrence of abnormal discharge or the like, and thus, this value is not preferable.

In the sintered object A, the fibrous carbon is three-dimensionally dispersed. Herein, the expression "the fibrous carbon is three-dimensionally dispersed" means that the fibrous carbon is randomly arranged without showing specific orientation properties, and is dispersed between the yttrium oxide particles (grain boundary). That is, when a certain volume is taken from the sintered object A and an average value of each fibrous carbon contained in the volume in the longitudinal direction is taken, the average value thereof becomes zero.

As the fibrous carbon, one kind or two kinds or more selected from a group of single layer carbon nanotubes (SWCNT: Single Walled Carbon Nanotubes), two layer carbon nanotubes (DWCNT: Double Walled Carbon Nanotubes), and multi-layer carbon nanotubes (MWCNT: Multi Walled Carbon Nanotubes) having a diameter of 30 nm or less and a length of 10 μm or less are used.

The fibrous carbons are randomly present between the yttrium oxide particles (the grain boundary), whereby the fibrous carbons partially come into contact with each other to form a network, thereby forming an route allowing electrical conduction in the grain boundary in the sintered object.

In addition, the fibrous carbon does not need to necessarily exist between the yttrium oxide particles (the grain boundary), and there may be a grain boundary in which the fibrous carbon does not exist.

The fibrous carbon exists in the matrix formed of the yttrium oxide particle as a single body of a fibrous carbon or a compacted object in which a plurality of the fibrous carbon of the single bodies is condensed, and the aggregation diameter (a diameter of the aggregated object) of the aggregated object is 5 μm or less, preferably, 2 μm or less.

Herein, when the aggregation diameter is greater than 5 μm, the fibrous carbon is easily destroyed by the halogen-based plasma, resistance to corrosion is lowered, electrical conductivity is lowered, and the generation of particles is caused. Thus, this value is not preferable. Particularly, when being used as a member for the semiconductor producing device, the portion of the aggregated object is selectively destroyed by the plasma, and as a consequence, a decline in resistance to corrosion, a decline in electrical conductivity, and occurrence of the particles are generated, and is not suitable as a member for the semiconductor producing device. Furthermore, the aggregated object causes the hindrance of the sintering, the density of the sintered object when performing the sintering at a low pressure is not improved, and a rate of decline in volume resistivity is also insufficient. Furthermore, the route allowing electrical conduction is hard to be formed, and in order to exhibit electrical conductivity obtained in the sintered object, there is a need to increase the content amount of the fibrous carbon.

The content rate of the fibrous carbon is preferably 0.5 volume % or more and 5 volume % or less with respect to the total amount of the fibrous carbon and the yttrium oxide, and more preferably, 1 volume % or more and 3 volume % or more.

Herein, when the content of the fibrous carbon is lower than 0.5 volume %, the formation of the route allowing electrical conduction is insufficient, and it is impossible to exhibit the electrical conductivity required for the sintered object. Meanwhile, when the content of the fibrous carbon is greater than 5 volume %, the fibrous carbon easily forms a large and coarse aggregated object that is greater than 10 μm, and resistance to corrosion is lowered.

When a relative density, that is, a ratio ($d_o/d_t$) of a real density ($d_o$) to a theoretical density ($d_t$) is expressed by percentage, the sintered object A becomes compact at 97% or more.

Furthermore, the volume resistivity value of the sintered object A is 0.5 Ω·cm or more and 10 Ω·cm or less.

Herein, in order that the volume resistivity value of the sintered object is less than 0.5 Ω·cm, there is a need to increase the content of the fibrous carbon. However, when increasing the content, the fibrous carbon is easily condensed, and resistance to corrosion declines, thus is not preferable. Furthermore, it is not economical in terms of cost. Meanwhile, if the volume resistivity value is greater than 10 Ω·cm, in a case of being used under various conditions in various vacuum process devices, the electrical matching with a member for the vacuum process device used simultaneously is difficult, and restrictions on the design are generated, and thus this value is not preferable.

The sintered object A has excellent resistance to corrosion of the halogen-based corrosive gases and the plasmas thereof, has excellent thermal conductivity, has the volume resistivity value of 10 Ω·cm or less and has excellent electrical conductivity.

In a case where the sintered object A is applied to the constitution member of the vacuum process device such as the etching device, the sputtering device, and the CVD device, there are few restrictions on design, the application range is also wide, and the versatility is also excellent.

Method of Producing Sintered Object A

A method of producing the sintered object A of the present embodiment has a mixed slurry preparing process of mixing a yttrium oxide slurry with a fibrous carbon slurry to form a mixed slurry, a granule forming process by spray-drying the mixed slurry to form the granules, and a sintering process of the granules under a pressure of 1 MPa or more and 20 MPa or less to form a sintered object.

Herein, in order to mix yttrium oxide with the fibrous carbon without condensing the fibrous carbon, it is desirable to prepare slurry in which the fibrous carbon is singly and uniformly dispersed in a dispersion medium in advance. Herein, the slurry in which yttrium oxide particles are uniformly dispersed in the dispersion medium and the slurry in which the fibrous carbon is uniformly dispersed in the dispersion medium are separately prepared in advance.

When preparing the yttrium oxide slurry, the yttrium oxide particles are added to and mixed with the dispersion medium so that the content thereof is 40 mass % or more and 70 mass %.

Herein, the reason for setting the content of the yttrium oxide particles to 40 mass or more and 70 mass % or less is to prevent an increase in viscosity of the mixed slurry when mixing the yttrium oxide slurry and the fibrous carbon slurry to prepare the mixed slurry.

Furthermore, when preparing the fibrous carbon slurry, the fibrous carbon (a solid content) is added to the dispersion medium so that the content is 0.5 mass % or more and 1.5 mass % or less, and the mixed matter including the fibrous carbon and the dispersion medium is subjected to the dispersion processing.

Herein, the reason for setting the content of the fibrous carbon in the fibrous carbon slurry to 0.5 mass % or more and 1.5 mass % or less is as below. When the content of the fibrous carbon is greater than 1.5 mass %, there is a risk of a re-aggregation of the fibrous carbon, the viscosity of the fibrous carbon slurry is increased, the deflocculation and the dispersion in the fibrous carbon aggregated object become difficult, and when being mixed with the yttrium oxide slurry, there is a problem in that the uniform mixed slurry cannot be obtained or the like.

In addition, if the content of the fibrous carbon in the fibrous carbon slurry is 1.5 mass % or less, there is no particular problem. However, if the content of the fibrous carbon is unnecessarily lowered, an absolute amount of the fibrous carbon in the slurry is reduced, and the amount of the solvent is excessive, and there is a problem such as production inefficiency and a high cost. For that reason, a lower limitation value of the content of the fibrous carbon is preferably 0.5 mass %.

An average secondary particle diameter of the fibrous carbon of the fibrous carbon slurry is preferably 400 nm or less.

When the average secondary particle diameter of the fibrous carbon is greater than 400 nm, when being mixed with the yttrium oxide slurry and being dried, the fibrous carbon is condensed, and the aggregated object of the fibrous carbon in the sintered object obtained by sintering later is coarse, and resistance to corrosion is lowered, and thus this value is not desirable.

By setting the average secondary particle diameter of the fibrous carbon in the fibrous carbon slurry to 400 nm or less, when being mixed with the yttrium oxide slurry, it is possible to prevent the fibrous carbon from being condensed again in the mixed slurry and during drying. As a result, the fibrous carbon in the sintered object does not form the coarse condensed matter, is three-dimensionally dispersed in the grain boundary of yttrium oxide particle, and the route allowing electrical conduction can be effectively formed.

As the dispersion medium used in the yttrium oxide slurry and the fibrous carbon slurry, water and organic solvents can be used. As the organic solvent, for example, monovalent alcohols and derivatives thereof such as methanol, ethanol, 2-propanol, butanol, octanol; monocyclic monoterpene alcohols such as α-terpineol; carbitols such as butyl carbitol; esters such as ethyl acetate, butyl acetate, ethyl lactate, propylene glycol monomethyl ether acetate, propylene glycol monoethyl ether acetate, butyl carbitol acetate, and γ-butyrolactone; ethers such as diethyl ether, ethylene glycol monomethyl ether (methyl cellosolve), ethylene glycol monoethyl ether (ethyl cellosolve), ethylene glycol monobutyl ether (butyl cellosolve), diethylene glycol monomethyl ether, and diethylene glycol monoethyl ether; ketones such as acetone, methyl ethyl ketone, methyl isobutyl ketone, acetylacetone, and cyclohexanone; aromatic hydrocarbons such as benzene, toluene, xylene, and ethylbenzene; and amides such as dimethylformamide, N,N-dimethylacetamide, and N-methylpyrrolidone, are preferably used and one or two kinds or more of the solvents can be used.

A dispersion agent and a binder may be added when preparing the slurries.

As the dispersion agent and the binder, for example, polycarboxylates such as ammonium salts of polycarboxylic acid, and organic polymers such as polyethylene glycol, polyvinyl alcohol, and polyvinyl pyrrolidone or the like are used.

Since a cohesive force of the fibrous carbon itself is strong, as the dispersion processing, there is a need to perform deflocculation by applying a mechanical force for pre-dispersion. Although it is not particularly limited, as the pre-dispersion method, a high-speed homogenizer or the like is adopted.

As the subsequent dispersion processing, although it is not particularly limited, a disperser such as an ultrasonic homogenizer, a bead mill, and an ultra high-pressure grinder may be used.

Next, the yttrium oxide slurry and the fibrous carbon slurry are mixed with each other to form the mixed slurry.

As the mixing method, although it is not particularly limited, for example, a method is used in which a rotation two-blade type homogenizer is combined with a wet ball mill.

Next, the mixed slurry is dried by a spray-drying method to obtain granules including the mixed particles of the yttrium oxide particles and the fibrous carbon.

Herein, by spray-drying the mixed slurry in the heated air flow, while maintaining the dispersion properties of the yttrium oxide particles and the fibrous carbon in the mixed slurry, the mixed particles including them are rapidly dried, and can be granulated.

Herein, the spraying and drying conditions of the mixed slurry are suitably adjusted so that the large granules are obtained in which satisfactory characteristics are obtained in the sintering process of the subsequent stage.

For example, the spray-drying condition of the mixed slurry is adjusted so that the average particle diameter of the granules becomes a size of 30 μm to 100 μm.

Next, the granules are sintered under a pressure of 1 MPa or more and 20 MPa or less to form the sintered object A.

Herein, the reason for setting the pressure during sintering to 1 MPa or more and 20 MPa or less is as below. When the pressure is less than 1 MPa, the density of the sintered object obtained is lowered, and resistance to corrosion is lowered. Furthermore, the compact sintered object is not obtained and electrical conductivity is also increased, the application is limited when being used as the member for the semiconductor producing device, and the versatility is impaired. Meanwhile, when the pressure is greater than 20 MPa, there is no problem of the density and electrical conductivity of the obtained sintered object, but when designing the sintering device of the large sintered object accompanied by an increase in size of the member, the pressing area is limited.

As the atmosphere during sintering, since there is a need to prevent the oxidation of the fibrous carbon, an inactive atmosphere such as nitrogen ($N_2$), argon (Ar) is preferable.

Furthermore, the sintering temperature is preferably 1600° C. or more and 1850° C. or less.

The reason that the sintering of the granules at 1600° C. or more and 1850° C. or less is preferable is as below. If the sintering temperature is less than 1600° C., the fibrous carbon hinders the sintering of yttrium oxide, and it is impossible to obtain the sintered object having a relative density of 97% or more. Meanwhile, if the sintering temperature is greater than 1850° C., yttrium oxide directly reacts with the fibrous carbon to form the carbide.

Furthermore, the sintering time is for example 1 to 6 hours as long as there is sufficient time to obtain the compact sintered object.

As mentioned above, when sintering the granules, by performing concurrently performing the pressurization of 1 MPa or more and 20 MPa or less, the density of the sintered object can be improved while suppressing the grain growth of yttrium oxide, and electrical conductivity of 10 Ω·cm or less can be expressed without cutting the route allowing electrical conduction formed by the fibrous carbon.

Furthermore, an embodiment for carrying out the high frequency transmission material of the present invention will be described.

The high frequency transmission material of the present embodiment is a composite material in which the fibrous carbon is dispersed in yttrium oxide. As the composite material, for example, the sintered object which is obtained by sintering the mixture including the fibrous carbon and yttrium oxide under the reducing atmosphere, the sheet-like sintered object which is obtained by sintering a sheet containing the fibrous carbon, yttrium oxide and solvent under the reducing atmosphere or the like are adopted.

The composite material contains the fibrous carbon of 1 volume % or more and 10 volume % or less with respect to the total amount of the fibrous carbon and yttrium oxide.

In the composite material, yttrium oxide ($Y_2O_3$) particles particularly having resistance to corrosion with respect to the halogen-based plasma constitute the matrix.

The average particle diameter of yttrium oxide particle is preferably 0.1 μm or more and 10 μm or less, and more preferably, 0.5 μm or more and 5 μm or less.

Herein, the reason for limiting the average particle diameter of yttrium oxide particle to 0.1 μm or more and 10 μm or less is as below. If the average particle diameter is less than 0.1 μm, since the grain boundary total number of yttrium oxide in the high frequency transmission material is increased, there is a need to increase the addition amount of the fibrous carbon so as to exhibit electrical conductivity in the high frequency transmission material. However, when increasing the addition amount of the fibrous carbon, it is difficult to express capacitance at high frequency. Furthermore, resistance to corrosion is lowered, electrical conductivity during use is lowered, and there is a risk of generation of particles.

Meanwhile, if the average particle diameter is 10 μm or more, electrical conductivity is expressed by an addition of small amount of the fibrous carbon. However, the grain boundary total number is reduced, and the fibrous carbon is localized, there is a deviation of electrical conductivity in the high frequency transmission material, and there is a risk of the problem such as an abnormal discharge when being used in the plasma processing device.

The content of the fibrous carbon to the total amount of the fibrous carbon and yttrium oxide is preferably 1 volume % or more and 10 volume % or less, and more preferably, 1 volume % or more and 2 volume % or less.

Herein, when the content of the fibrous carbon is less than 1 volume %, the formation of the route allowing electrical conduction in the composite material is insufficient, and it is impossible to express electrical conductivity required for the composite material. Meanwhile, when the content of the fibrous carbon is greater than 10 volume %, high frequency electrical characteristics of the fibrous carbon become dominant, and behavior of the inductance properties in the high frequency band of 10 MHz or more is shown. Furthermore, it is easy to form the large coarse aggregated object having the fibrous carbon that is greater than 5 μm, and resistance to corrosion is lowered.

Furthermore, when producing the high frequency transmission material by sintering, it becomes a factor that inhibits the sintering.

In the composite material, the fibrous carbon of a single body or a plurality of single bodies of the fibrous carbon is present in the matrix formed of yttrium oxide as the aggregated object.

Herein, when a plurality of the fibrous carbon particles of the single body is condensed to form the aggregated object, the aggregation diameter of the aggregated object is preferably 5 μm or less, and more preferably, 2 μm or less.

Herein, if the aggregation diameter of the aggregated object in the high frequency transmission material is greater than 5 μm, when being used as the member for the plasma processing device, the aggregated object is selectively destroyed by the plasma and resistance to corrosion is lowered. As a consequence, a decline in electrical conductivity and an occurrence of particles is generated, and is not suitable as the member for the plasma processing device.

Furthermore, in a case where the member is produced by the ceramic process such as the sintering, the fibrous carbon becomes a factor that inhibits the sintering of the member, the density of the member itself is not improved during low-temperature sintering, and a decline in volume resistance rate is also insufficient. Furthermore, it is difficult to form the route allowing electrical conduction, and there is a need to increase the content of the fibrous carbon so as to express electrical conductivity required as the member.

In the composite material, the fibrous carbon is three-dimensionally dispersed in the matrix formed of yttrium oxide. Herein, the expression "the fibrous carbon is three-dimensionally dispersed" means that the fibrous carbon is randomly arranged without showing a specific orientation and is dispersed between the yttrium oxide particles (the grain boundary). That is, when a constant volume is taken from the high frequency transmission material and an average value of the fibrous carbon contained in the volume in the longitudinal direction is taken, the average value becomes zero.

The fibrous carbon is randomly present between the yttrium oxide particles (the grain boundary), whereby the fibrous carbon particles partly come into contact with each other to form a network, and thus the route allowing electrical conduction is formed in the grain boundary in the sintered object.

In addition, the fibrous carbon does not need to be necessarily present between the yttrium oxide particles (the grain boundary), and the grain boundary may be a grain boundary in which the fibrous carbon is not present.

Although it is not particularly limited, the length of the fibrous carbon is preferably 0.1 μm or more and 10 μm or less when considering the dispersion properties or the like, and more preferably, 0.5 μm or more and 5 μm or less.

Herein, if the length of the fibrous carbon is greater than 10 μm, it is difficult for the fibrous carbon to be uniformly dispersed in the grain boundary of the yttrium oxide particles. In some cases, the coarse condensed matter is easily formed, and resistance to corrosion is also lowered. Furthermore, if the inductance properties dominate capacitive properties at high frequency, the impedance angle in the high frequency band of 10 MHz or more is positive (a positive value) or fluctuates from the positive (the positive value) to a negative (a negative value), and thus, the plasma is instable, and this becomes a factor of the occurrence of the abnormal discharge.

Herein, the impedance angle is a phase difference between the current and the voltage in the high frequency. In the case of the positive (the positive value), this is inductivity, that is, the inductance properties. In the case of the negative (the negative value), this is capacity, that is, the capacitance properties.

The high frequency transmission material of the present embodiment is a material which has electrical conductivity in the direct current and has the impedance angle of a negative (the negative value), and is greatly different from a material in which the electrical conductive matter in the normal direct current has the positive (the positive value) impedance angle.

The reason is because the electrons have properties conflicting with each other such as particle properties and fluctuation properties, and in the direct current, the electrons flow and the particle properties are dominant. In this case, the electrons flow due to the potential difference in the fibrous carbon, and the direct current conductivity are shown. Meanwhile, in the high frequency, the fluctuation properties are dominant. For example, when the fibrous carbon having the diameter that is extremely smaller compared to the wavelength is independently present, it is considered that the high frequency does not enter the inner portion of the fibrous carbon and is transmitted therethrough. Thus, in a system in which the fibrous carbon is independently dispersed, direct-current conductivity corresponding to the addition amount of the fibrous carbon and capacitance corresponding to the high frequency are obtained.

If the content amount is high, the fibrous carbon has preferable direct current conductivity, but the high frequency capacitance is lowered. Thus, as the fibrous carbon, the carbon nanotubes having high electrical conductivity in a small amount are preferable.

As the carbon nanotube, one kind or two kinds or more selected from a group of single layer carbon nanotubes (SWCNT: Single Walled Carbon Nanotubes), two layer carbon nanotubes (DWCNT: Double Walled Carbon Nanotubes), and multi-layer carbon nanotubes (MWCNT: Multi Walled Carbon Nanotubes) can be used suitably.

The fibrous carbon has properties of low direct current resistance value as Fe content amount becomes smaller, and thus, in order to sufficiently secure electrical conductivity to the direct current, the content amount of Fe is preferably 5000 ppm or less.

In the high frequency transmission material of the present embodiment, the volume resistivity value when the direct current voltage is applied is preferably 30 Ω·cm or less.

Herein, if the volume resistivity value when applying the direct current voltage of the high frequency transmission material is applied is greater than 30 Ω·cm, an alleviation of the potential fluctuation during plasma generation is insufficient, and thus, the electric field is generated in the inner surface of the sample to destroy a circuit or the like formed on the sample, and the defective fraction of the product is increased, and is not preferable.

When a relative density, that is, a ratio ($d_0/d_t$) of a real density ($d_0$) to a theoretical density ($d_t$) is expressed by percentage, the high frequency transmission material has the density of 96% or more.

The high frequency transmission material has excellent resistance to corrosion of the halogen-based corrosive gases and the plasmas thereof in the high frequency, has excellent thermal conductivity, has the volume resistivity value of 30 Ω·cm or less and excellent electrical conductivity.

When the high frequency transmission material is applied to the constituting member of the plasma processing device such as the etching device and the sputtering device, there are fewer restrictions on design, the application range is wide, and versatility is excellent.

As the method of producing the high frequency transmission material, if the high frequency transmission material having the properties mentioned above is obtained, the method is not particularly limited. However, a method of preparing the mixed powder in which yttrium oxide is mixed with the fibrous carbon and then molding and sintering the mixed powder to obtain the sintered object is preferable.

As the method of preparing the mixed powder, the yttrium oxide power may be directly mixed with the fibrous carbon, and the yttrium oxide powder and the fibrous carbon may be mixed with each other in liquid phase and then may be dried.

Particularly, in order to uniformly disperse the fibrous carbon in yttrium oxide without the coarse aggregation, a method of individually preparing the yttrium oxide slurry in which yttrium oxide is dispersed in liquid phase and the fibrous carbon slurry in which the fibrous carbon is dispersed in a liquid phase, mixing the yttrium oxide slurry with the fibrous carbon slurry to form the mixed slurry, spray-drying the mixed slurry, and sintering the mixed slurry under an inert atmosphere, thereby forming the sintered object is preferable.

As the atmosphere during sintering, since there is a need to prevent the oxidation of the fibrous carbon, an inert atmosphere such as nitrogen ($N_2$) and argon (Ar) is preferable.

Furthermore, the sintering temperature is preferably 1600° C. or more and 1850° C. or less.

The reason is as below. If the sintering temperature is less than 1600° C., the fibrous carbon inhibits the sintering of yttrium oxide, and it is impossible to obtain the sintered objects having the relative density of 97% or more. Meanwhile, if the sintering temperature is greater than 1850° C., yttrium oxide directly reacts with the fibrous carbon to form carbide.

Furthermore, if the sintering time is sufficient to obtain the compact sintered object, the sintering time is, for example, 1 to 6 hours.

Hereinafter, an embodiment for carrying out the sintered object B and the method of producing the same will be described.

Sintered Object B

A sintered object B of the present embodiment contains yttrium oxide and fibrous carbon, has a relative density of 95% or more, a volume resistivity value of 30 Ω·cm or more and 1000 Ω·cm or less, and the fibrous carbon is three-dimensionally dispersed in the boundary of the yttrium oxide and an aggregation diameter thereof is 1 μm or less.

In the sintered object B, yttrium oxide ($Y_2O_3$) particles having high resistance to corrosion of halogen-based plasma constitute a matrix.

An average particle diameter of the yttrium oxide particles is preferably 0.1 μm or more and 10 μm or less, and more preferably, 0.5 μm or more and 5 μm or less.

Herein, a reason for limiting the average particle size of yttrium oxide particle to 0.1 μm or more and 10 μm or less is as follows. If the average particle size is less than 0.1 μm, since a grain boundary total number of yttrium oxide in the sintered object is increased, there is a need to increase an addition amount of fibrous carbon so as to impart electrical conductivity. However, when increasing the addition amount of fibrous carbon, resistance to corrosion is lowered and is not preferable. Meanwhile, when the average particle diameter is greater than 10 μm, since the addition amount of fibrous carbon is reduced, the electrical conductivity is improved, but the grain boundary total amount of yttrium oxide in the sintered object is reduced. Thus, fibrous carbon locally exists, deviation is generated in the electrical conductivity in the sintered object, and when being applied to the vacuum process device, there is a risk of an occurrence of abnormal discharge or the like, and thus, this value is not preferable. Furthermore, since the surface area of yttrium oxide is reduced, surface energy, which is driving force of the sintering, is reduced, and thus it is difficult to obtain the sintered object of high density.

In the sintered object B, the fibrous carbon is three-dimensionally dispersed in the grain boundary of the yttrium oxide. Herein, the expression "the fibrous carbon is three-dimensionally dispersed" means that the fibrous carbon is randomly arranged without showing specific orientation properties, and is dispersed between the yttrium oxide particles (the grain boundary). That is, when a certain volume is taken from the sintered object B and an average value of each fibrous carbon contained in the volume in the longitudinal direction is taken, the average value thereof becomes zero.

As the fibrous carbon, one kind or two kinds or more selected from a group of single layer carbon nanotubes (SWCNT: Single Walled Carbon Nanotubes), two layer carbon nanotubes (DWCNT: Double Walled Carbon Nanotubes), and multi-walled carbon nanotubes (MWCNT: Multi Walled Carbon Nanotubes) having a diameter of 30 nm or less and a length of 10 μm or less are used.

The fibrous carbon is randomly present between the yttrium oxide particles (the grain boundary), whereby the fibrous carbon particles partially come into contact with each other to from a network, thereby forming an route allowing electrical conduction in the grain boundary in the sintered object.

In addition, the fibrous carbon does not need to necessarily exist between the yttrium oxide particles (the grain boundary), and there may be a grain boundary in which the fibrous carbon does not exist.

The fibrous carbon exists in the matrix formed of the yttrium oxide particle as a single body or a aggregated object in which a plurality of the fibrous carbon of the single bodies is condensed, and when forming the aggregated object, the aggregation diameter (a diameter of the aggregated object) of the aggregated object is 1 μm or less, preferably, 0.5 μm or less.

Herein, if the aggregation diameter is greater than 1 μm, when being used as the member for the semiconductor producing device, the condensed section is easily worn by the halogen-based plasma, resistance to corrosion is lowered, electrical conductivity lowered, the occurrence of the particle is generated and thus, this value is not suitable as the member for the semiconductor producing device.

Furthermore, the aggregated object causes the hindrance of the sintering, the density of the sintered object when performing the sintering at a low pressure is not improved, and a rate of decline in volume resistivity is not also sufficiently lowered, and this value is not desirable.

The content rate of the fibrous carbon is preferably 0.5 volume % or more and 2 volume % or less with respect to the total amount of the fibrous carbon and the yttrium oxide, and more preferably, 1 volume % or more and 1.5 volume % or less.

Herein, when the content of the fibrous carbon is lower than 0.5 volume %, the formation of the route allowing electrical conduction is insufficient, and it is impossible to exhibit the electrical conductivity required for the sintered object. Meanwhile, when the content of the fibrous carbon is greater than 2 volume %, the fibrous carbon easily forms a coarse aggregated object that is greater than 1 μm, and resistance to corrosion is lowered.

When a relative density, that is, a ratio ($d_o/d_t$) of a real density ($d_o$) to a theoretical density ($d_t$) is expressed by percentage, the sintered object B becomes compact of 95% or more.

Furthermore, the volume resistivity value of the sintered object B is 30 Ω·cm or more and 1000 Ω·cm or less.

Herein, in order that the volume resistivity value of the sintered object is less than 30 Ω·cm, there is a need to increase the content of the fibrous carbon. However, when increasing the content, the fibrous carbon is easily condensed, and resistance to corrosion declines, thus is not preferable. Furthermore, if the content of the fibrous carbon is high, the impedance angle of the sintered object has a positive value when the high frequency is applied, and the electrical characteristics are changed from capacitive to inductive. Furthermore, since the impedance angle is greatly changed by the frequency, when being used in the semiconductor producing device, it is difficult to impart the electrical matching properties, and there is trouble in versatility. Furthermore, it is not economical in terms of cost. Meanwhile, if the volume resistivity value is greater than 1000 Ω·cm, the addition amount of the fibrous carbon is reduced, and the fibrous carbon is locally present. Thus, the deviation is generated in the electrical conductivity of the sintered object, and the problems such as an abnormal discharge when being used in the vacuum process device arise, and thus this value is not preferable.

The sintered object B has excellent resistance to corrosion of the halogen-based corrosive gases and the plasmas thereof, has excellent thermal conductivity, has the volume resistivity value of 30 Ω·cm or more and 1000 Ω·cm or less, and has excellent electrical conductivity.

In a case where the sintered object B is applied to the constitution member of the vacuum process device such as the etching device, the sputtering device, and the CVD device, there are fewer restrictions on design, the application range is also wide, and the versatility is also excellent.

Method of Producing Sintered Object B

A method of producing the sintered object B of the present embodiment has a mixed slurry preparing process of mixing a yttrium oxide slurry with a fibrous carbon slurry to form a mixed slurry, a granule forming process by spray-drying the mixed slurry to form the granules, and a sintering process of the granules under a pressure of 1 MPa or more and 20 MPa or less to form a sintered object.

Herein, in order to mix yttrium oxide with the fibrous carbon without condensing the fibrous carbon, it is desirable to individually prepare the yttrium oxide slurry in which the yttrium oxide particles are uniformly dispersed in a dispersion medium, and the fibrous carbon slurry in which the fibrous carbon is uniformly dispersed in a dispersion medium in advance, and then mix the yttrium oxide slurring with the fibrous carbon slurry to form the mixed slurry.

When preparing the yttrium oxide slurry, the yttrium oxide particles are added to and mixed with the dispersion medium so that the content thereof is 40 mass % or more and 70 mass %. In this case, the dispersion agent may be added as necessary.

Herein, the reason for setting the content of the yttrium oxide particles to 40 mass % or more and 70 mass % is to prevent an increase in viscosity of the mixed slurry when mixing the yttrium oxide slurry to the fibrous carbon slurry to prepare the mixed slurry.

Furthermore, when preparing the fibrous carbon slurry, the fibrous carbon (a solid content) is added to the dispersion medium so that the content is 0.5 mass % or more and 1.5 mass % or less, and the mixed matter including the fibrous carbon and the dispersion medium is subjected to the dispersion processing.

Herein, the reason for setting the content of the fibrous carbon in the fibrous carbon slurry to 0.5 mass % or more and 1.5 mass % or less is as below. When the content of the fibrous carbon is greater than 1.5 mass %, there is a risk of a re-aggregation of the fibrous carbon, the viscosity of the fibrous carbon slurry is increased, the fibrous carbon slurry has high viscosity, and the deflocculation and the dispersion in the fibrous carbon aggregated object are difficult, and when being mixed with the yttrium oxide slurry, there is a problem in that the uniformly mixed slurry cannot be obtained or the like.

In addition, if the content of the fibrous carbon in the fibrous carbon slurry is 1.5 mass % or less, there is no particular problem. However, if the content of the fibrous carbon is unnecessarily lowered, an absolute amount of the fibrous carbon in the slurry is reduced, and the amount of the solvent is excessive, and there is a problem such as production inefficiency and a high cost. For that reason, a lower limitation value of the content of the fibrous carbon is preferably 0.5 mass %.

An average secondary particle diameter of the fibrous carbon in the fibrous carbon slurry is preferably 200 nm or less.

When the average secondary particle diameter of the fibrous carbon is greater than 200 nm, when being mixed with the yttrium oxide slurry and being dried, the fibrous carbon is condensed, and the aggregated object in the sintered object obtained by sintering later is coarse, and resistance to corrosion is lowered, and thus this value is not desirable.

By setting the average secondary particle diameter of the fibrous carbon in the fibrous carbon slurry to 200 nm or less, when being mixed with the yttrium oxide slurry, it is possible to prevent the fibrous carbon from being condensed again in the mixed slurry and during drying. As a result, the fibrous carbon in the sintered object does not form the coarse condensed matter, is three-dimensionally dispersed in the grain boundary of yttrium oxide particle, and the route allowing electrical conduction can be effectively formed.

As the dispersion medium used in the yttrium oxide slurry and the fibrous carbon slurry, water and organic solvents can be used. As the organic solvent, for example, monovalent alcohols and derivatives thereof such as methanol, ethanol, 2-propanol, butanol, octanol; monocyclic monoterpene alcohols such as α-terpineol; carbitols such as butyl carbitol; esters such as ethyl acetate, butyl acetate, ethyl lactate, propylene glycol monomethyl ether acetate, propylene glycol monoethyl ether acetate, butyl carbitol acetate, and γ-butyrolactone; ethers such as diethyl ether, ethylene glycol monomethyl ether (methyl cellosolve), ethylene glycol monoethyl ether (ethyl cellosolve), ethylene glycol monobutyl ether (butyl cellosolve), diethylene glycol monomethyl ether, and diethylene glycol monoethyl ether; ketones such as acetone, methyl ethyl ketone, methyl isobutyl ketone, acetylacetone, and cyclohexanone; aromatic hydrocarbons such as benzene, toluene, xylene, and ethylbenzene; and amides such as dimethylformamide, N,N-dimethylacetamide, and N-methylpyrrolidone, are preferably used and one or two kinds or more of the solvents can be used.

A dispersion agent and a binder may be added when preparing the slurries.

As the dispersion agent and the binder, for example, polycarboxylates such as polycarboxylic acid ammonium salt, and organic polymers such as polyethylene glycol, polyvinyl alcohol, and polyvinyl pyrrolidone or the like are used.

Since a cohesive force of the fibrous carbon itself is strong, as the dispersion processing, there is a need to perform the deflocculation by applying a mechanical force as the pre-dispersion. Although it is not particularly limited, as the pre-dispersion method, a high-speed homogenizer or the like is adopted.

For the dispersion processing after that, although it is not particularly limited, a disperser such as an ultrasonic homogenizer, a bead mill, and an ultra high-pressure grinder is used.

Next, the yttrium oxide slurry and the fibrous carbon slurry are mixed with each other to form the mixed slurry.

As the mixing method, although it is not particularly limited, for example, a method is used in which a rotation two-blade type homogenizer is combined with a wet ball mill.

Next, the mixed slurry is dried by spray-drying method to obtain a granules including the mixed particles of the yttrium oxide particles and the fibrous carbon.

Herein, by spray-drying the mixed slurry in the heated air flow, while maintaining the dispersion properties of the yttrium oxide particles and the fibrous carbon in the mixed slurry, the mixed particles including them are rapidly dried, and can be granulated.

Herein, the spray-drying condition of the mixed slurry is suitably adjusted so that the large granules are obtained in which satisfactory characteristics are obtained in the sintering process of the subsequent stage.

For example, the spraying and drying conditions of the mixed slurry are adjusted so that the average particle diameter of the granules becomes the size of 30 μm to 100 μm.

Next, the granules are sintered under pressure of 1 MPa or more and 20 MPa or less to form the sintered object B.

Herein, the reason for setting the pressure during sintering to 1 MPa or more and 20 MPa or less is as below. When the pressure is less than 1 MPa, the density of the sintered object obtained is lowered, and resistance to corrosion is lowered. Furthermore, the compact sintered object is not obtained and electrical conductivity is also increased, the application is limited when being used as the member for the semiconductor producing device, and the versatility is impaired. This is considered due to the fact that the sintering of yttrium oxide proceeds, a part thereof is condensed due to the rearrangement of the fibrous carbon, and the three-dimensional arrangement is lost.

Meanwhile, when the pressure is greater than 20 MPa, there is no problem of the density and electrical conductivity of the obtained sintered object, but when designing the sintering device of the large sintered object accompanied by an increase in size of the member, the pressing area is limited.

As the atmosphere during sintering, since there is a need to prevent the oxidation of the fibrous carbon, an inactive atmosphere such as nitrogen ($N_2$), argon (Ar) is preferable.

Furthermore, the sintering temperature is preferably 1600° C. or more and 1850° C. or less.

The reason that the sintering of the granules at 1600° C. or more and 1850° C. or less is preferable is as below. If the sintering temperature is less than 1600° C., the fibrous carbon hinders the sintering of yttrium oxide, and it is impossible to obtain the sintered object having a relative density of 95% or more. Meanwhile, if the sintering temperature is greater than 1850° C., yttrium oxide directly reacts with the fibrous carbon to form the carbide.

Furthermore, the sintering time is for example 1 to 6 hours if there is a time enough to obtain the compact sintered object.

As mentioned above, when sintering the granules, by performing concurrently performing the pressurization of 1 MPa or more and 20 MPa or less, the density of the sintered object can be improved while suppressing the grain growth of yttrium oxide, and electrical conductivity having volume resistivity value of 30 Ω·cm or more and 1000 Ω·cm or less can be expressed without cutting the route allowing electrical conduction formed by the fibrous carbon.

In the sintered object B thus obtained, in the frequency band of 10 MHz to 1 GHz, the impedance angle showing the electric characteristics of the material is always in the range of −70° to −90°. The range shows high capacitive properties, and is the same characteristics as those of the insulating ceramic member, for example, yttrium oxide single body. That is, the member is a conductive member and shows capacitive properties when applying the high frequency. Furthermore, since the content amount of the fibrous carbon is minute, substantially the same resistance to corrosion as that of yttrium oxide single body is exhibited. Thus, as the member for the semiconductor producing device, the substitution for the current insulating member in which the electrical conductivity is required, and an application to the member to which the high frequency is applied are exhibited.

According to the sintered object B of the present embodiment, the relative density of the sintered object containing yttrium oxide and fibrous carbon is 95% or more, the volume resistivity value is 30 Ω·cm or more and 1000 Ω·cm or less, the fibrous carbon is three-dimensionally dispersed in the grain boundary of yttrium oxide, and the aggregation diameter is 1 μm or less. Thus, electrical conductivity is low, resistance to corrosion of halogen-based corrosive gases and the plasmas thereof can be improved, there is no frequency dependency when the high frequency is applied thereto, and the plasma can be stabilized.

According to the method of producing the sintered object B of the present embodiment, since the average secondary particle diameter in the fibrous carbon slurry is 200 nm or less, and the content of the fibrous carbon is 0.5 mass % or more and 1.5 mass % or less, when the fibrous carbon slurry is mixed with the yttrium oxide slurry, it is possible to suppress that the fibrous carbon is condensed in the mixed slurry and during drying again. As a consequence, the fibrous carbon in the sintered object does not form the coarse condensed matter of 1 μm or more, but is three-dimensionally dispersed in the yttrium oxide grain boundary, whereby the route allowing electrical conduction can be effectively formed.

Furthermore, by concurrently performing the pressurization of 1 MPa or more and 20 MPa or less during sintering, the density of the sintered object can be improved while suppressing the particle growth of yttrium oxide. Thus, it is possible to control electrical conductivity so that the volume resistivity value is 30 Ω·cm or more and 1000 Ω·cm or less, without cutting the route allowing electrical conduction formed by the fibrous carbon.

EXAMPLES

Hereinafter, the present invention will be further specifically described by examples and comparative examples, but the present invention is not limited to the examples mentioned below.

Example 1

A. Production of Sintered Object A

Multi-walled carbon nanotubes (CNT) having a diameter of 10 nm to 50 nm and a length of 1 μm to 25 μm were added to pure water so that the content (the solid content) of the multi-walled carbon nanotubes was 0.5 mass %, a dispersion agent was added, and then deflocculation pre-treatment was performed by a rotation two-blade type homogenizer device. Next, dispersion processing was performed by an ultrasonic homogenizer for 5 hours. The secondary particle diameter of the obtained carbon nanotubes slurry was 300 nm.

Furthermore, yttrium oxide powders having an average particle diameter 3 μm was added to the pure water so that the content (the solid content) of the yttrium oxide powder was 40 mass %, the dispersion agent was added, and then the stirring was performed by the stirrer, and the yttrium oxide slurry was adjusted.

Next, the carbon nanotube slurry and the yttrium oxide slurry were prepared and mixed so that the content of the carbon nanotubes in the solid content was 3 volume %, were stirred with the stirrer, and the mixed slurry was prepared.

Next, the mixed slurry was subjected to the spray-drying method, and the composite particles of the carbon nanotubes and yttrium oxide were dried and granulated. The particle diameter of the obtained granules was 30 to 100 μm.

Next, the granules were subjected to the degreasing processing in an inactive atmosphere using nitrogen ($N_2$) gas, and then were sintered under an argon atmosphere at 1850° C. and a pressure of 20 MPa for two hours, whereby the sintered object A of Example 1 was produced.

B. Evaluation of Sintered Object A

The relative density and the volume resistivity value of the sintered object A, the aggregation diameter of the carbon nanotubes (CNT), the etching rate and the thermal conductivity were measured and evaluated. The evaluation method is as below.

(1) Relative Density

A real density ($d_0$) of the sintered object A was measured by Archimedes method, and the ratio ($d_0/d_t$) of the real density ($d_0$) to a theoretical density ($d_t$) was expressed by percentage and was set as the relative density (%).

(2) Volume Resistivity Value

The voltage used for measurement was 10 V by a four-terminal method using a resistivity meter LORESTA GP (produced by Mitsubishi Chemical Analytic Company).

(3) Aggregation Diameter of CNT

The surface of the sintered object A was observed by a scanning type electron microscope (SEM) at a magnification of 50,000 times, the respective aggregation diameters of twelve aggregated objects of the CNT were measured, and the average thereof was calculated.

(4) Etching Rate

The plasma was exposed to the mixed gas of sulfur hexafluoride ($SF_6$), oxygen and argon for three hours, the etching rate (nm/hr) was measured, and the corrosion resistance was evaluated by the measured value.

(5) Thermal Conductivity

The measurement was performed by a laser flash method as regulated in Japanese Industrial Standards JIS R 1611 "Measuring Method of Thermal Diffusivity, Specific Heat Capacity and Thermal Conductivity using Flash Method of Fine Ceramics". Herein, the shape of the test piece was a disc shape having a diameter of 10 mm and a thickness of 2 mm.

As results of the measurements thereof, the relative density of the sintered object A was 99.7%, the volume resistivity value was 1.7 Ω·cm, the aggregation diameter of CNT was 1.9 µm, the etching rate was 172.6 nm/hr, and the thermal conductivity was 10.6 W/m·K.

Example 2

The sintered object A of Example 2 was produced and evaluated according to Example 1 except that the dispersion processing using the ultrasonic homogenizer was performed for 10 hours, and the average secondary particle diameter of the carbon nanotube slurry was 170 nm.

The relative density of the obtained sintered object A was 99.9%, the volume resistivity value was 0.8 Ω·cm, the aggregation diameter of CNT was 1.2 µm, the etching rate was 154.7 nm/hr, and the thermal conductivity was 11.4 W/m·K.

Example 3

The sintered object A of Example 3 was produced and evaluated according to Example 1 except that the sintering was performed at a pressure of 1 MPa for 2 hours.

The relative density of the obtained sintered object A was 97.1%, the volume resistivity value was 5.2 Ω·cm, the aggregation diameter of CNT was 2.4 µm, the etching rate was 190.5 nm/hr, and the thermal conductivity was 10.2 W/m·K.

Example 4

The sintered object A of Example 4 was produced and evaluated according to Example 1 except that the carbon nanotube slurry and the yttrium oxide slurry were prepared and mixed, and were stirred to prepared the mixed slurry so that the content of the carbon nanotubes in the solid content is 0.5 volume %.

The relative density of the obtained sintered object A was 99.9%, the volume resistivity value was 9.9 Ω·cm, the aggregation diameter of CNT was 0.5 µm, the etching rate was 122.2 nm/hr, and the thermal conductivity was 13.8 W/m·K.

Example 5

The sintered object A of Example 5 was produced and evaluated according to Example 1 except that the content of the carbon nanotubes in the solid content is 5.0 volume %.

The relative density of the obtained sintered object A was 99.4%, the volume resistivity value was 0.5 Ω·cm, the aggregation diameter of CNT was 4.8 µm, the etching rate was 251.4 nm/hr, and the thermal conductivity was 9.1 W/m·K.

Example 6

The sintered object A of Example 6 was produced and evaluated according to Example 1 except that the dispersion processing using the ultrasonic homogenizer was performed for 4 hours, and the average secondary particle diameter of the carbon nanotube slurry was 400 nm.

The relative density of the obtained sintered object A was 99.6%, the volume resistivity value was 2.0 Ω·cm, the aggregation diameter of CNT was 2.2 µm, the etching rate was 188.4 nm/hr, and the thermal conductivity was 10.3 W/m·K.

Comparative Example 1

The sintered object of Comparative Example 1 was produced and evaluated according to Example 1 except that the dispersion processing using the ultrasonic homogenizer was performed for 1 hour, and the average secondary particle diameter of the carbon nanotube slurry was 860 nm.

The relative density of the obtained sintered object was 99.0%, the volume resistivity value was 12 Ω·cm, the aggregation diameter of CNT was 8.2 µm, the etching rate was 356.2 nm/hr, and the thermal conductivity was 9.6 W/m·K.

Comparative Example 2

The sintered object of Comparative Example 2 was produced and evaluated according to Example 1 except for performing the sintering without the pressing.

The relative density of the obtained sintered object was 92.8%, the volume resistivity value was 42 Ω·cm, the aggregation diameter of CNT was 3.2 µm, the etching rate was 228.7 nm/hr, and the thermal conductivity was 9.9 W/m·K.

Comparative Example 3

The sintered object of Comparative Example 3 was produced and evaluated according to Example 1 except for not adding the carbon nanotubes (the content of the carbon nanotubes was 0.0 volume %).

The relative density of the obtained sintered object was 100.0%, the volume resistivity value was $10^8$ Ω·cm or more (the measurement limit value or more), the etching rate was 100.0 nm/hr, and the thermal conductivity was 16.0 W/m·K.

Comparative Example 4

The sintered object of Comparative Example 4 was produced and evaluated according to Example 1 except that the content of the carbon nanotubes in the solid content was 10.0 volume %.

The relative density of the obtained sintered object was 98.1%, the volume resistivity value was 0.1 Ω·cm, the aggregation diameter of CNT was 12.2 µm, the etching rate was 601.4 nm/hr, and the thermal conductivity was 8.5 W/m·K.

The measurement results of Examples 1 to 5 and Comparative Examples 1 to 4 are shown in Table 1.

TABLE 1

| | Content of CNT (volume %) | Sintering pressure (MPa) | CNT slurry average secondary particle diameter (nm) | Relative density (%) | Volume resistivity value ($\Omega \cdot cm$) | Aggregation diameter of CNT ($\mu m$) | Etching rate (nm/hr) | Thermal conductivity ($W/m \cdot K$) |
|---|---|---|---|---|---|---|---|---|
| Example 1 | 3.0 | 20 | 300 | 99.7 | 1.7 | 1.9 | 172.6 | 10.6 |
| Example 2 | 3.0 | 20 | 170 | 99.9 | 0.8 | 1.2 | 154.7 | 11.4 |
| Example 3 | 3.0 | 1 | 300 | 97.1 | 5.2 | 2.4 | 190.5 | 10.2 |
| Example 4 | 0.5 | 20 | 300 | 99.9 | 9.9 | 0.5 | 122.2 | 13.8 |
| Example 5 | 5.0 | 20 | 300 | 99.4 | 0.5 | 4.8 | 251.4 | 9.1 |
| Example 6 | 3.0 | 20 | 400 | 99.6 | 2.0 | 2.2 | 188.4 | 10.3 |
| Comparative Example 1 | 3.0 | 20 | 860 | 99.0 | 12 | 8.2 | 356.2 | 9.6 |
| Comparative Example 2 | 3.0 | 0 | 300 | 92.8 | 42 | 3.2 | 228.7 | 9.9 |
| Comparative Example 3 | 0.0 | 20 | — | 100.0 | >$10^8$ | — | 100.0 | 16.0 |
| Comparative Example 4 | 10.0 | 20 | 300 | 98.1 | 0.1 | 12.2 | 601.4 | 8.5 |

Example 7

A. Production of Sintered Object

The multi-walled carbon nanotubes having a diameter of 5 nm to 15 nm, a length of 1 μm to 2 μm, and a content amount of Fe of less than 5,000 ppm were added to pure water, the dispersion agent was added thereto, and then the pre-treatment was performed by the rotation two-blade type homogenizer device.

Next, the dispersion processing was performed by the ultrasonic homogenizer for 5 hours to prepare a carbon nanotube slurry having a secondary particle diameter of 300 nm.

Furthermore, a yttrium oxide powder having an average particle diameter 3 μm was put into the pure water, a dispersion agent was added thereto, and then the stirring was performed with a stirrer to prepare the yttrium oxide slurry.

Next, the carbon nanotube slurry and the yttrium oxide slurry were prepared and mixed so that the content of the carbon nanotubes in the solid content was 2 volume %, were stirred with the stirrer, and the mixed slurry was prepared.

Next, the mixed slurry was dried and granulated by the spray-drying method to manufacture the granules formed of the composite particles of the carbon nanotubes and yttrium oxide. Next, the granules were subjected to the degreasing processing, and then were sintered under an argon atmosphere at 1850° C. and a pressure of 20 MPa for two hours, whereby the sintered object of Example 7 was produced.

B. Evaluation of Sintered Object

A disc-shaped sample having the diameter of 33 mm and the thickness of 0.3 mm was cut from the sintered object, and the relative density of the sample and the volume resistivity value in the direct current were measured and evaluated.

Furthermore, the impedance angle in the high frequency of 10 MHz to 300 MHz was measured and evaluated. The evaluation method is as below.

(1) Relative Density

A real density ($d_0$) of the sample was measured by Archimedes method, and the ratio ($d_0/d_t$) of the real density ($d_0$) to a theoretical density ($d_t$) was expressed by percentage and was set as the relative density (%).

(2) Volume Resistivity Value

The measurement voltage was measured as 10 V by a four-terminal method using a resistivity meter LORESTA GP (produced by Mitsubishi Chemical Analytic Company).

(3) Impedance Angle

The impedance angle was measured in the high frequency of 10 MHz to 300 MHz by a capacity method using an impedance analyzer (produced by Agilent Technologies Company).

According to the evaluation result mentioned above, the relative density of the obtained sintered object was 99.7%, and the volume resistivity value was 1.7 $\Omega \cdot cm$. Furthermore, the impedance angle was negative (−) in the high frequency band of 10 MHz to 300 MHz, and showed the capacitive properties.

Example 8

The sintered object of Example 8 was produced and evaluated according to Example 7 except for performing the preparation and the mixing so that the content of the carbon nanotubes in the solid content is 6 volume %.

The relative density of the obtained sintered object was 98.3%, and the volume resistivity value was 0.4 $\Omega \cdot cm$. Furthermore, the impedance angle was negative (−) in the high frequency band of 10 MHz to 300 MHz, and showed the capacitive properties.

Example 9

The sintered object of Example 9 was produced and evaluated according to Example 7 except for performing the preparation and the mixing so that the content of the carbon nanotubes in the solid content is 8 volume %.

The relative density of the obtained sintered object was 98.0%, and the volume resistivity value was 0.2 $\Omega \cdot cm$.

Furthermore, the impedance angle was negative (−) in the high frequency band of 10 MHz to 300 MHz, and showed the capacitive properties.

Example 10

The sintered object of Example 10 was produced and evaluated according to Example 7 except that the pressure when sintering is 1 MPa.

The relative density of the obtained sintered object was 96.0%, and the volume resistivity value was 3.6 $\Omega \cdot cm$.

Furthermore, the impedance angle was negative (−) in the high frequency band of 10 MHz to 300 MHz, and showed the capacitive properties.

Example 11

The sintered object of Example 11 was produced and evaluated according to Example 7 except for performing the preparation and the mixing so that the content of the carbon nanotubes in the solid content is 1.2 volume %.

The relative density of the obtained sintered object was 99.8%, and the volume resistivity value was 25 Ω·cm. Furthermore, the impedance angle was negative (−) in the high frequency band of 10 MHz to 300 MHz, and showed the capacitive properties.

Example 12

The sintered object of Example 12 was produced and evaluated according to Example 7 except for using the multi-walled carbon nanotubes having a diameter of 100 nm to 200 nm, a length of 10 μm to 20 μm, and a content amount of Fe of less than 5,000 ppm.

The relative density of the obtained sintered object was 96.3%, and the volume resistivity value was 0.05 Ω·cm. Furthermore, the impedance angle was negative (−) in the high frequency band of 10 MHz to 300 MHz, and showed the capacitive properties.

Comparative Example 5

The sintered object of Comparative Example 5 was produced and evaluated according to Example 7 except for performing the preparation and the mixing so that the content of the carbon nanotubes in the solid content is 20 volume %.

The relative density of the obtained sintered object was 99.4%, and the volume resistivity value was 0.1 Ω·cm.

Furthermore, the impedance angle was positive (+) in the high frequency band of 10 MHz to 300 MHz, and showed the inductive properties.

Comparative Example 6

The sintered object of Comparative Example 6 was produced and evaluated according to Example 7 except for performing the preparation and the mixing so that the content of the carbon nanotubes in the solid content is 0 volume %.

The relative density of the obtained sintered object was 99.0%, the volume resistivity value was $10^8$ Ω·cm, and the volume resistivity value exceeded the measurement upper limit value of the measurement device.

Furthermore, the impedance angle was negative (−) in the high frequency band of 10 MHz to 300 MHz, and showed the capacitive properties.

Table 2 shows the evaluation results of the respective sintered object of Examples 7 to 12 and Comparative Examples 5 and 6, and FIG. 1 shows the impedance angles in the high frequency band of 10 MHz to 300 MHz of Examples 7 to 12, respectively.

Example 13

A. Production of Sintered Object B

Multi-walled carbon nanotubes (CNT) having a diameter of 5 nm to 15 nm and a length of 1 μm to 2 μm were added to pure water so that the content (the solid content) of the multi-walled carbon nanotubes was 1.0 mass %, a dispersion agent was added, and then deflocculation pre-treatment was performed by a rotation two-blade type homogenizer device.

Next, the dispersion processing was performed by a wet jet mill. The secondary particle diameter of the obtained carbon nanotubes slurry was 120 nm.

Furthermore, yttrium oxide powder having an average particle diameter 3 μm was added to pure water so that the content (the solid content) of the yttrium oxide powder was 40 mass %, a dispersion agent was added, and then stirring was performed with a stirrer, and the yttrium oxide slurry was adjusted.

Next, the carbon nanotube slurry and the yttrium oxide slurry were prepared and mixed so that the content of the carbon nanotubes in the solid content is 1.0 volume %, were stirred with the stirrer, and the mixed slurry was prepared.

Next, the mixed slurry was subjected to the spray-drying method, and the composite particles of the carbon nanotubes and yttrium oxide were dried and granulated. The particle diameter of the obtained granules was 30 to 100 μm.

Next, the granules were subjected to the degreasing processing in an inactive atmosphere using nitrogen ($N_2$) gas, and then were sintered under the argon atmosphere at 1850° C. and the pressure of 20 MPa for 2 hours, whereby the sintered object B of Example 13 was produced.

B. Evaluation of Sintered Object B

The disc-shaped sample piece having a diameter of 48 mm and a thickness of 4 mm was cut from the sintered object B, and the relative density of the sample and the volume resistivity value in the direct current were measured and evaluated. Furthermore, the disc-shaped sample piece having the diameter of 33 mm and the thickness of 0.3 mm was cut from the sintered object B, and the impedance angle at the high frequency of 10 MHz to 1 GHz was measured. Furthermore, the aggregation diameter of the carbon nanotubes (CNT) was measured and evaluated from the fracture surface of the sintered object B. Furthermore, the disc-shaped sample piece having the diameter of 10 mm and the thickness of 2 mm was cut from the sintered object B, and the thermal conductivity was measured and evaluated. The evaluation method is as below.

TABLE 2

| | CNT | | Content amount of CNT (vol %) | Pressure (MPa) | Sign of impedance angle (°) | Volume resistivity value (DC; Ω·cm) |
|---|---|---|---|---|---|---|
| | diameter (nm) | length (μm) | | | | |
| Example 7 | 5 to 15 | 1 to 2 | 2 | 20 | − | 1.7 |
| Example 8 | 5 to 15 | 1 to 2 | 6 | 20 | − | 0.4 |
| Example 9 | 5 to 15 | 1 to 2 | 8 | 20 | − | 0.2 |
| Example 10 | 5 to 15 | 1 to 2 | 2 | 1 | − | 3.6 |
| Example 11 | 5 to 15 | 1 to 2 | 1.2 | 20 | − | 25 |
| Example 12 | 100 to 200 | 10 to 20 | 10 | 20 | − | 0.05 |
| Comparative Example 5 | 5 to 15 | 1 to 2 | 20 | 20 | + | 0.1 |
| Comparative Example 6 | — | | 0 | 20 | − | >$10^8$ |

(1) Relative Density

A real density ($d_0$) of the sintered object B was measured by Archimedes method, and the ratio ($d_0/d_t$) of the real density ($d_0$) to a theoretical density ($d_t$) was expressed by percentage and was set as the relative density (%).

(2) Volume Resistivity Value

The voltage used for measurement was 90 V by a four-terminal method using a resistivity meter LORESTA GP (produced by Mitsubishi Chemical Analytic Company).

(3) Impedance Angle

The respective impedance angles of 10 MHz, 100 MHz and 1 GHz were measured by a three-terminal method using an impedance analyzer (produced by Agilent Technologies Company).

(4) Aggregation Diameter of CNT

The surface of the sintered object B was observed by a scanning type electron microscope (SEM) at a magnification of 50,000 times, the respective aggregation diameters of twelve aggregated objects of the CNT were measured, and the average thereof was calculated.

(5) Etching Rate

The plasma was exposed to a mixed gas of sulfur hexafluoride ($SF_6$), oxygen and argon for three hours, the etching rate (nm/hr) was measured, and the corrosion resistance was evaluated by the measured value.

(6) Thermal Conductivity

The measurement was performed by a laser flash method as regulated in Japanese Industrial Standards JIS R 1611 "Measuring Method of Thermal Diffusivity, Specific Heat Capacity and Thermal Conductivity using Flash Method of Fine Ceramics".

As a result of the measurement thereof, the relative density of the sintered object B was 99.6%, and the volume resistivity value was 125.1 Ω·cm.

Furthermore, the impedance angle was −79° at 10 MHz, −79° at 100 MHz, and −80° at 1 GHz, and the frequency dependency was not confirmed, and the impedance angle was always negative, that is, the capacitive properties.

Furthermore, the aggregation diameter of the CNT was 0.5 µm, the etching rate was 115.8 nm/hr, and the thermal conductivity was 13.7 W/m·K.

Example 14

The sintered object B of Example 14 was produced and evaluated according to Example 13 except for preparing the mixed slurry so that the content of the carbon nanotubes in the solid content is 0.5 volume %.

The relative density of the obtained sintered object B was 99.7%, and the volume resistivity value was 924.2 Ω·cm.

Furthermore, the impedance angle was −83° at 10 MHz, −84° at 100 MHz, and −85° at 1 GHz, and the frequency dependency was not confirmed, and the impedance angle was always negative, that is, the capacitive properties.

Furthermore, the aggregation diameter of the CNT was 0.4 µm, the etching rate was 110.5 nm/hr, and the thermal conductivity was 14.1 W/m·K.

Example 15

The sintered object B of Example 15 was produced and evaluated according to Example 13 except for preparing the mixed slurry so that the content of the carbon nanotubes in the solid content is 1.5 volume %.

The relative density of the obtained sintered object B was 99.5%, and the volume resistivity value was 37.4 Ω·cm.

Furthermore, the impedance angle was −77° at 10 MHz, −77° at 100 MHz, and −76° at 1 GHz, and the frequency dependency was not confirmed, and the impedance angle was always negative, that is, the capacitive properties.

Furthermore, the aggregation diameter of the CNT was 0.7 µm, the etching rate was 121.7 nm/hr, and the thermal conductivity was 13.2 W/m·K.

Example 16

The sintered object B of Example 16 was produced and evaluated according to Example 13 except for preparing the mixed slurry so that the content of the carbon nanotubes in the solid content is 2.0 volume %.

The relative density of the obtained sintered object B was 99.3%, and the volume resistivity value was 10.5 Ω·cm.

Furthermore, the impedance angle was −70° at 10 MHz, −72° at 100 MHz, and −74° at 1 GHz, and the frequency dependency was not confirmed, and the impedance angle was always negative, that is, the capacitive properties.

Furthermore, the aggregation diameter of the CNT was 1.0 µm, the etching rate was 128.0 nm/hr, and the thermal conductivity was 12.5 W/m·K.

Example 17

The sintered object B of Example 17 was produced and evaluated according to Example 13 except for performing the sintering at the pressure of 1 MPa for 2 hours.

The relative density of the obtained sintered object B was 97.2%, and the volume resistivity value was 320.6 Ω·cm.

Furthermore, the impedance angle was −79° at 10 MHz, −80° at 100 MHz, and −82° at 1 GHz, and the frequency dependency was not confirmed, and the impedance angle was always negative, that is, the capacitive properties.

Furthermore, the aggregation diameter of the CNT was 0.6 µm, the etching rate was 124.6 nm/hr, and the thermal conductivity was 13.1 W/m·K.

Comparative Example 7

The sintered object of Comparative Example 7 was produced and evaluated according to Example 13 except for not adding the carbon nanotubes (the content of the carbon nanotubes is 0.0 volume %).

The relative density of the obtained sintered object was 100.0%, and the volume resistivity value was $10^8$ Ω·cm or more (the measurement limit or more).

Furthermore, the impedance angle was −87° at 10 MHz, −89° at 100 MHz, and −90° at 1 GHz, and the frequency dependency was not confirmed, and the impedance angle was always negative, that is, the capacitive properties.

Furthermore, the etching rate was 100.0 nm/hr, and the thermal conductivity was 16.0 W/m·K.

Comparative Example 8

The sintered object of Comparative Example 8 was produced and evaluated according to Example 13 except for preparing the mixed slurry so that the content of the carbon nanotubes in the solid content is 4.0 volume %.

The relative density of the obtained sintered object was 99.0%, and the volume resistivity value was 1.2 Ω·cm.

Furthermore, the impedance angle was +24° at 10 MHz, −25° at 100 MHz, and −67° at 1 GHz, and the frequency dependency was confirmed, and the impedance angle was changed from positive to negative depending on the frequency, that is, the electrical characteristics were changed from inductive to the capacitive properties.

Furthermore, the aggregation diameter of the CNT was 2.1 µm, the etching rate was 194.3 nm/hr, and the thermal conductivity was 10.6 W/m·K.

Comparative Example 9

The sintered object of Comparative Example 9 was produced and evaluated according to Example 13 except for performing the preparation so that the secondary particle diameter of the carbon nanotube slurry is 400 nm.

The relative density of the obtained sintered object was 99.4%, and the volume resistivity value was 2416.2 Ω·cm.

Furthermore, the impedance angle was −85° at 10 MHz, −86° at 100 MHz, and −86° at 1 GHz, and the frequency dependency was not confirmed, and the impedance angle was always negative, that is, the capacitive properties.

Furthermore, the aggregation diameter of the CNT was 1.6 µm, the etching rate was 158.7 nm/hr, and the thermal conductivity was 12.4 W/m·K.

Comparative Example 10

The sintered object of Comparative Example 10 was produced and evaluated according to Example 13 except for performing the sintering at a pressure unload (0 MPa).

The relative density of the obtained sintered object was 94.8%, and the volume resistivity value was $10^8$ Ω·cm or more (the measurement limit or more).

Furthermore, the impedance angle was −81° at 10 MHz, −82° at 100 MHz, and −82° at 1 GHz, and the frequency dependency was not confirmed, and the impedance angle was always negative, that is, the capacitive properties.

Furthermore, the aggregation diameter of the CNT was 1.7 µm, the etching rate was 162.8 nm/hr, and the thermal conductivity was 12.1 W/m·K.

Comparative Example 11

The sintered object of Comparative Example 11 was produced and evaluated according to Example 13 except for replacing with the multi-walled carbon nanotubes (CNT) having the diameter of 5 nm to 15 nm and the length of 1 µm to 25 µm.

The secondary particle diameter of the obtained carbon nanotube slurry was 700 nm, the relative density of the obtained sintered object was 99.1%, and the volume resistivity value was 50.2 Ω·cm.

Furthermore, the impedance angle was +20° at 10 MHz, −31° at 100 MHz, and −71° at 1 GHz, and the frequency dependency was confirmed, and the impedance angle was changed from positive to negative depending on the frequency, that is, the electrical characteristics were changed from inductive to capacitive properties.

Furthermore, the aggregation diameter of the CNT was 2.0 µm, the etching rate was 160.3 nm/hr, and the thermal conductivity was 13.5 W/m·K.

The measurement results of Examples 13 to 17 and Comparative Examples 7 to 11 are shown in Tables 3 and 4.

TABLE 3

| | Content of CNT (volume %) | Length of CNT (µm) | Sintering pressure (MPa) | Average secondary particle diameter of CNT slurry (nm) | Relative density (%) | Volume resistivity value(Ω · cm) |
|---|---|---|---|---|---|---|
| Example 13 | 1.0 | 1 to 2 | 20 | 120 | 99.6 | 125.1 |
| Example 14 | 0.5 | 1 to 2 | 20 | 120 | 99.7 | 924.2 |
| Example 15 | 1.5 | 1 to 2 | 20 | 120 | 99.5 | 37.4 |
| Example 16 | 2.0 | 1 to 2 | 20 | 120 | 99.3 | 10.5 |
| Example 17 | 1.0 | 1 to 2 | 1 | 120 | 97.2 | 320.6 |
| Comparative Example 7 | 0.0 | 1 to 2 | 20 | — | 100.0 | >$10^8$ |
| Comparative Example 8 | 4.0 | 1 to 2 | 20 | 120 | 99.0 | 1.2 |
| Comparative Example 9 | 1.0 | 1 to 2 | 20 | 400 | 99.4 | 2416.2 |
| Comparative Example 10 | 1.0 | 1 to 2 | 0 | 120 | 94.8 | >$10^8$ |
| Comparative Example 11 | 1.0 | 1 to 25 | 20 | 700 | 99.1 | 50.2 |

TABLE 4

| | Impedance angle (°) | | | Aggregation diameter of CNT (µm) | Etching rate (nm/hr) | Thermal conductivity (W/m · K) |
|---|---|---|---|---|---|---|
| | 10 MHz | 100 MHz | 1 GHz | | | |
| Example 13 | −79 | −79 | −80 | 0.5 | 115.8 | 13.7 |
| Example 14 | −83 | −84 | −85 | 0.4 | 110.5 | 14.1 |
| Example 15 | −77 | −77 | −76 | 0.7 | 121.7 | 13.2 |
| Example 16 | −70 | −72 | −74 | 1.0 | 128.0 | 12.5 |
| Example 17 | −79 | −80 | −82 | 0.6 | 124.6 | 13.1 |
| Comparative Example 7 | −87 | −89 | −90 | — | 100.0 | 16.0 |
| Comparative Example 8 | +24 | −25 | −67 | 2.1 | 194.3 | 10.6 |
| Comparative Example 9 | −85 | −86 | −86 | 1.6 | 158.7 | 12.4 |
| Comparative Example 10 | −81 | −82 | −82 | 1.7 | 162.8 | 12.1 |
| Comparative Example 11 | +20 | −31 | −71 | 2.0 | 160.3 | 13.5 |

INDUSTRIAL APPLICABILITY

According to the sintered object of the present invention, it is possible to improve resistance to corrosion of halogen-based corrosive gases and the plasmas thereof and reduce a decline in electrical conductivity. Furthermore, the sintered object of the present invention is particularly and preferably used in an etching electrode and a focus ring, and even in a case of being applied to a member for use in various vacuum process devices, the sintered object has few limitations on design, is usable in a wide range of applications, and has excellent versatility. Thus, the present invention is extremely industrially useful.

The invention claimed is:

1. A sintered object containing yttrium oxide and fibrous carbon,
   wherein a relative density of the sintered object is 97% or more, and a volume resistivity value of the sintered object upon which a corrosion test has not been performed is 0.5 Ω·cm or more and 10 Ω·cm or less,
   wherein the fibrous carbon is three-dimensionally dispersed, and an aggregation diameter of the fibrous carbon is 5 μm or less,
   wherein a content of the fibrous carbon is 0.5 volume % or more and 5 volume % or less with respect to a total amount of the fibrous carbon and yttrium oxide, and
   wherein the diameter of the fibrous carbon is 30 nm or less, and the length of the fibrous carbon is 10 μm or less.

2. The sintered object according to claim 1,
   wherein the fibrous carbon is one type or two types or more selected from a group consisting of single-walled carbon nanotubes, two-walled carbon nanotubes and multi-walled carbon nanotubes.

3. A method of producing the sintered object according to claim 1, comprising:
   a mixed slurry preparing process of mixing a yttrium oxide slurry with a fibrous carbon slurry to form a mixed slurry, wherein the fibrous slurry is subjected to dispersion processing for 4 to 10 hours and wherein an average secondary particle diameter of fibrous carbon in the fibrous carbon slurry is 400 nm or less;
   a granule forming process of spray-drying the mixed slurry to form granules; and
   a sintering process of the granules under a pressure of 1 MPa or more and 20 MPa or less to form a sintered object.

4. The sintered object according to claim 1,
   wherein said sintered object is produced by a method comprising:
      a mixed slurry preparing process of mixing a yttrium oxide slurry with a fibrous carbon slurry to form a mixed slurry;
      a granule forming process of spray-drying the mixed slurry to form granules; and
      a sintering process of the granules under a pressure of 1 MPa or more and 20 MPa or less,
   wherein an average secondary particle diameter of fibrous carbon in the fibrous carbon slurry is 400 nm or less.

5. A high frequency transmission material formed of a composite material in which fibrous carbon is dispersed in yttrium oxide,
   wherein the material contains fibrous carbon at 1 volume % or more and 10 volume % or less with respect to a total amount of the fibrous carbon and the yttrium oxide,
   wherein the length of the fibrous carbon is from 0.1 μm to 10 μm, and
   wherein a volume resistivity value during application of a direct-current voltage is 30 Ω·cm or less, and an impedance angle at a frequency of 10 MHz is a negative value.

6. The high frequency transmission material according to claim 5,
   wherein the fibrous carbon is carbon nanotubes.

7. The high frequency transmission material according to claim 5,
   wherein the fibrous carbon is dispersed in a grain boundary of the yttrium oxide.

8. The high frequency transmission material according to claim 5,
   wherein said high frequency transmission material is produced by a method comprising mixing the yttrium oxide slurry with the fibrous carbon slurry to form the mixed slurry, spray-drying the mixed slurry, and sintering the mixed slurry under an reducing atmosphere,
   wherein an average secondary particle diameter of fibrous carbon in the fibrous carbon slurry is 400 nm or less.

9. A sintered object which contains yttrium oxide and a fibrous carbon,
   wherein a relative density of the sintered object is 95% or more, and a volume resistivity value of the sintered object is 30 Ω·cm or more and 1000 Ω·cm or less,
   wherein the fibrous carbon is three-dimensionally dispersed in a grain boundary of the yttrium oxide, and an aggregation diameter of the fibrous carbon is 1 μm or less,
   wherein the length of the fibrous carbon is 10 μm or less,
   wherein a content of the fibrous carbon is 0.5 volume % to 1.5 volume % with respect to a total amount of the fibrous carbon and the yttrium oxide, and
   wherein an impedance angle at a frequency of 10 MHz is a negative value.

10. The sintered object according to claim 9,
    wherein the fibrous carbon is one kind or two kinds or more selected from a group consisting of single-walled carbon nanotubes, two-walled carbon nanotubes and multi-walled carbon nanotubes.

11. The sintered object according to claim 9,
    wherein an average particle diameter of the yttrium oxide is 0.1 μm or more and 10 μm or less.

12. The sintered object according to claim 9,
    wherein an impedance angle at a frequency of 10 MHz is in a range of −90° or more and −70° or less.

13. The sintered object according to claim 9,
    wherein said sintered object is produced by a method comprising:
       a mixed slurry preparing process of mixing a yttrium oxide slurry with a fibrous carbon slurry to form a mixed slurry;
       a granule forming process of spray-drying the mixed slurry to form granules; and
       a sintering process of the granules under a pressure of 1 MPa or more and 20 MPa or less,
    wherein an average secondary particle diameter of fibrous carbon in the fibrous carbon slurry is 200 nm or less.

14. A method of producing the sintered object according to claim 9, comprising:
    a mixed slurry preparing process of mixing a yttrium oxide slurry with a fibrous carbon slurry to form a mixed slurry, wherein the fibrous slurry is subjected to dispersion processing for 4 to 10 hours and wherein an average secondary particle diameter of fibrous carbon in the fibrous carbon slurry is 400 nm or less;
    a granule forming process of spray-drying the mixed slurry to form granules; and
    a sintering process of the granules under a pressure of 1 MPa or more and 20 MPa or less to form a sintered object.

15. The method of producing the sintered object according to claim 14,
    wherein an average secondary particle diameter of the fibrous carbon in the fibrous carbon slurry is 200 nm or less.

* * * * *